US008432184B2

(12) United States Patent
Lasky

(10) Patent No.: US 8,432,184 B2
(45) Date of Patent: Apr. 30, 2013

(54) TERMINATION DEVICE AND SYSTEM AND METHOD FOR TERMINATION FOR AN ALARM SYSTEM PERIPHERAL DEVICE

(75) Inventor: Mark Lasky, Riverwoods, IL (US)

(73) Assignee: Mark Lasky, Riverswoods, IL (US)

( * ) Notice: Subject to any disclaimer, the term of this patent is extended or adjusted under 35 U.S.C. 154(b) by 40 days.

(21) Appl. No.: 13/066,718

(22) Filed: Apr. 22, 2011

(65) Prior Publication Data

US 2012/0268161 A1 Oct. 25, 2012

(51) Int. Cl.
*H01P 1/22* (2006.01)
*H03K 17/16* (2006.01)
*H03K 19/00* (2006.01)

(52) U.S. Cl.
USPC ............................ 326/30; 326/136; 333/22 R

(58) Field of Classification Search .................... 326/30; 333/22 R
See application file for complete search history.

(56) References Cited

U.S. PATENT DOCUMENTS

| | | | | |
|---|---|---|---|---|
| 7,012,200 | B2 | 3/2006 | Møller | |
| 7,692,510 | B2 * | 4/2010 | Lasky | 333/22 R |
| 2007/0103186 | A1 * | 5/2007 | Clements et al. | 326/30 |
| 2009/0108963 | A1 | 4/2009 | Lasky | |

* cited by examiner

*Primary Examiner* — Thienvu Tran
(74) *Attorney, Agent, or Firm* — Patents+TMS, P.C.

(57) ABSTRACT

A termination device and a system and a method terminate a peripheral device of an alarm system. The termination device connects to wiring extending from the peripheral device. The termination device may have a resistor, a diode and/or a similar component which provides electrical resistance. The termination device may have a potentiometer which may enable a user to adjust the electrical resistance. The termination device may have a blade which cuts the wiring.

20 Claims, 2 Drawing Sheets

FIG. 1
PRIOR ART
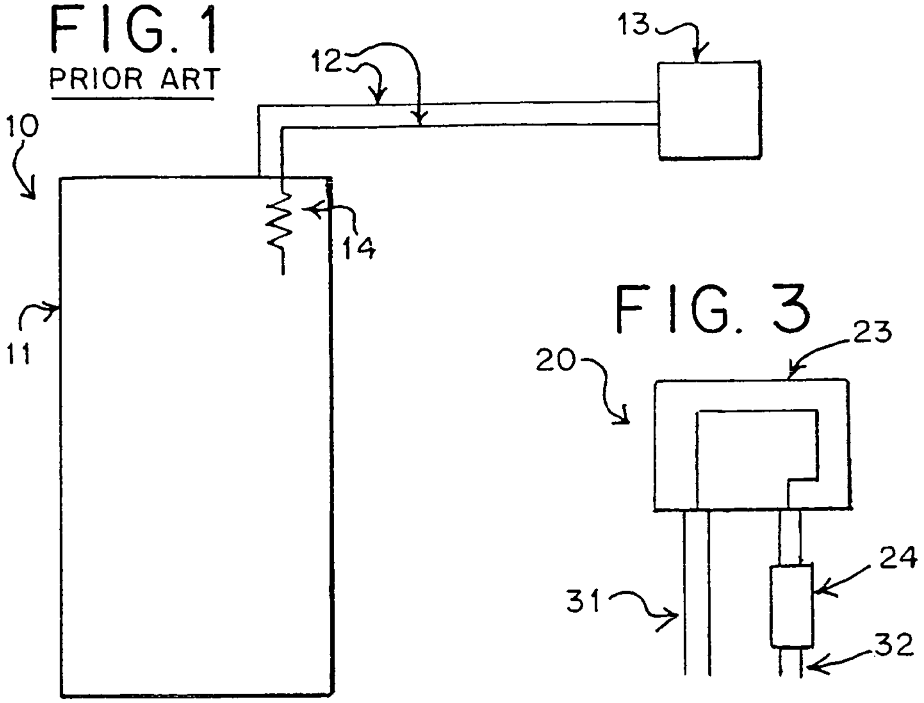
FIG. 3
FIG. 2
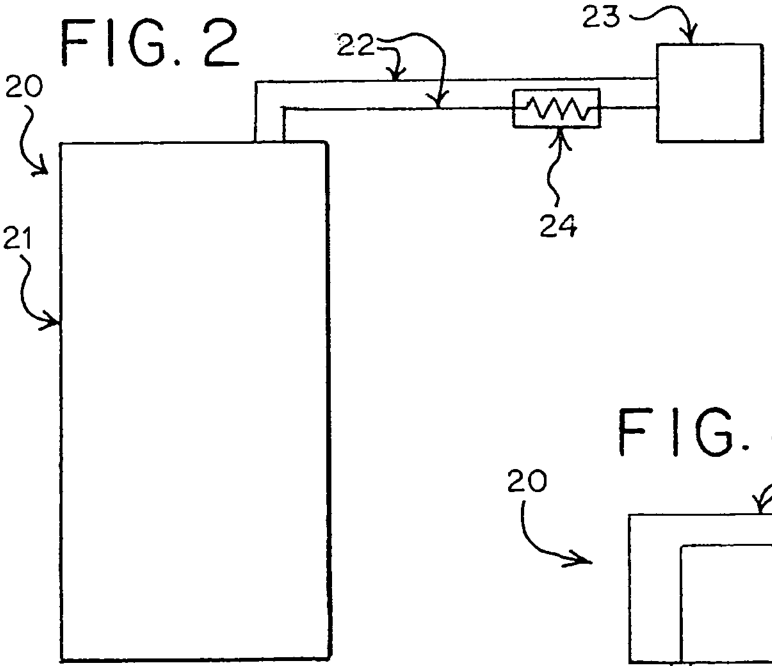
FIG. 4
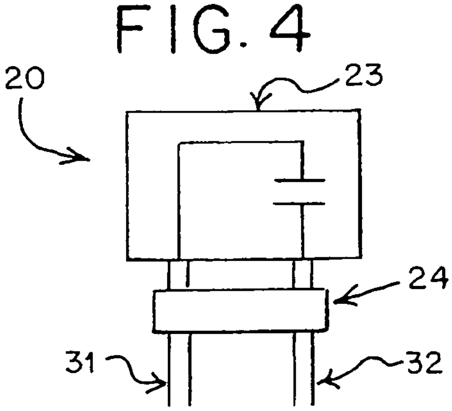

TERMINATION DEVICE AND SYSTEM AND METHOD FOR TERMINATION FOR AN ALARM SYSTEM PERIPHERAL DEVICE

BACKGROUND OF THE INVENTION

The present invention generally relates to a termination device and a system and a method for termination for an alarm system peripheral device.

In burglar alarm, fire alarm and access control systems and similar alarm systems, a peripheral device is connected to a control panel for monitoring the system. The peripheral device has an End-of-Line (EOL) component known as a termination device, and the termination device is typically a resistor. The termination device varies both in type and in resistance value based on selections of a control panel manufacturer. The main purpose of the termination device is to allow the control panel to differentiate between an open circuit and a short circuit by establishing a known resistance so that changes to the resistance may be detected. More specifically, the resistor determines the intensity of the current flowing in the protection loop to which the peripheral device is attached. A change in the current results in the control panel generating an alarm.

In prior art systems, an electrician or device installer must manually connect the termination device to the circuit either by soldering or by connection to a set of electrical terminals. Connection of the termination device to the circuit requires that each termination device must be individually selected and manually installed at remote locations. As a result, many device installers install the termination device in the control panel which typically defeats the purpose of the termination device. Hand-installed termination devices have a tendency to fail, and faulty termination at the control panel may cause false alarms on the system or render the protection loop ineffective by failing to detect an alarm state that is present.

More specifically, most alarm system faults due to faulty wiring occur in one of two ways. First, a short circuit on the system may result from faulty wiring contacting grounded components to produce a "short circuit fault." Second, the contact between system components may be broken to produce an "open circuit" fault in the system. Both a short circuit fault and an open circuit fault are problematic; most alarm systems treat "open circuit" faults as false alarms, and "short circuit" faults may cause an actual alarm to go unreported if the terminating device is installed in the wrong position, such as at the control panel.

Pre-installation of termination devices within the peripheral devices is possible, but termination devices vary greatly by the manufacturer. Therefore, termination devices are typically specially ordered which may cause delays and added cost for a project.

Therefore, a need exists for an apparatus, a system and method for installing termination devices on peripheral devices of alarm systems which reduce the potential for errors and delays in installation.

SUMMARY OF THE INVENTION

The present invention generally relates to a termination device and a system and a method for termination for an alarm system peripheral device. More specifically, the present invention relates to a termination device which connects to wiring extending from the peripheral device. The termination device may contain a resistor, a diode and/or a similar component which provides electrical resistance.

To this end, in an embodiment of the present invention, a system for terminating an alarm signal protection loop connected to a control panel is provided. The system has a peripheral component connected to the alarm signal protection loop; a first wire which extends from the peripheral component to connect the peripheral component to the alarm signal protection loop wherein the first wire conveys voltage between the control panel and the peripheral device; a termination device which connects to the first wire at a position adjacent to the peripheral component wherein the termination device has a housing; and a resistor connected to the housing of the termination device wherein the termination device connects to the first wire to convey voltage from the first wire through the resistor and further wherein the resistor provides an electrical resistance.

In an embodiment, the system has a blade which extends from the housing wherein the blade has an edge which cuts the first wire when the termination device is connected to the first wire.

In an embodiment, the system has an extension protruding from the housing wherein the extension inserts in a groove in the housing to maintain connection of the termination device to the first wire.

In an embodiment, the system has a compartment in the housing wherein the resistor inserts in and removes from the compartment to reversibly connect and disconnect the resistor to the termination device.

In an embodiment, the resistor is integral with the housing.

In an embodiment, the resistor is a potentiometer which enables a user to change the electrical resistance.

In an embodiment, the system has an electrically conductive gel associated with the housing.

In an embodiment, the system has a first pin and a second pin integral with the housing wherein the first pin is located in a position opposite to the second pin and further wherein the first pin and the second pin convey the voltage between the resistor and the wire.

In an embodiment, the system has a second wire which conveys the voltage from the peripheral device wherein the first wire conveys voltage to the peripheral device and further wherein a first end of the termination device connects to the first wire wherein a second end connects to the second wire and further wherein the first end is located in a position opposite to the second end.

In another embodiment of the present invention, a termination device for terminating an alarm signal protection loop connected to a control panel and a peripheral device is provided. The termination device has a housing; a first section of the housing wherein the first section has a first side and a second side wherein the first side is located in a position opposite to the second side; a second section of the housing wherein the second section is located in a position opposite to the first section and further wherein the second section has a first side and a second side wherein the first side is located in a position opposite to the second side and further wherein the second side of the first section is connected to the first side of the second section wherein the second section rotates relative to the first section so that the second side of the second section moves in a direction toward the first side of the first section and moves in an opposite direction away from the first side of the first section; a blade which extends from the first section of the housing wherein the blade has an edge located in a position opposite to the first section of the housing; and one of a resistor and a diode connected to the second section of the housing to provide an electrical resistance.

In an embodiment, the termination device has an electrically conductive gel associated with at least one of the first section, the second section and the blade.

In an embodiment, the termination device has an additional resistor that replaces the resistor in the second section wherein the additional resistor has a different electrical resistance relative to the resistor.

In an embodiment, the termination device has an extension which protrudes from one of the first section and the second section wherein the opposite section has a groove into which the extension inserts.

In an embodiment, the termination device has two potentiometers which form the resistor wherein each of the two potentiometers has a different maximum electrical resistance and further wherein the two potentiometers enable a user to change the electrical resistance.

In another embodiment of the present invention, a method for terminating an alarm signal protection loop connected to a control panel and a peripheral device is provided. The method has the steps of connecting a termination device to wiring of the alarm signal protection loop wherein the termination device is connected to the wiring at position adjacent to the peripheral device; cutting the wiring with a blade which extends from the termination device wherein connecting the termination device to the wiring cuts the wiring with the blade; and generating electrical resistance for voltage conveyed by the wiring wherein a resistor connected to the termination device generates the electrical resistance.

In an embodiment, the method has the step of selecting the resistor so that the electrical resistance generated by the resistor conforms to requirements of the control panel wherein the resistor is selected and placed in a compartment in the termination device before connecting the termination device to the wiring.

In an embodiment, the method has the step of adjusting the electrical resistance generated by the resistor wherein the resistor is a potentiometer which enables a user to adjust the electrical resistance.

In an embodiment, the method has the step of rotating a second section of the termination device toward a first section of the termination device while the wiring is located between the first section and the second section wherein rotating the second section toward the first section with the wire between the first section and the second section connects the termination device to the wiring.

In an embodiment, the method has the step of inserting an extension that extends from the termination device into a groove located in the termination device wherein inserting the extension into the groove connects the termination device to the wiring.

In an embodiment, the method has the step of preventing oxidation of the wiring wherein an electrically conductive gel affixed to the termination device prevents the oxidation.

It is, therefore, an advantage of the present invention to provide a termination device and a system and a method for termination for an alarm system peripheral device.

Another advantage of the present invention is to provide a termination device which may be quickly and/or easily installed on an alarm system peripheral device.

Further, an advantage of the present invention is to provide a termination device and a system and a method for termination for an alarm system peripheral device which may generate a desired resistance value.

Yet another advantage of the present invention is to provide a termination device and a system and a method for termination for an alarm system peripheral device which generate a resistance value and may enable a user to adjust the resistance value.

In addition, an advantage of the present invention is to provide a termination device and a system and a method for termination for an alarm system peripheral device which may generate a resistance value required by a control panel in communication with the termination device.

Another advantage of the present invention is to provide a termination device and a system and a method for termination for an alarm system peripheral device which make the alarm system more secure relative to alarm systems which use known termination devices.

Still further, an advantage of the present invention is to provide a termination device and a system and a method for termination for an alarm system peripheral device which decrease false alarms relative to alarm systems which use known termination devices.

Yet another advantage of the present invention is to provide a termination device and a system and a method for termination for an alarm system peripheral device which detect an alarm state more reliably relative to alarm systems which use known termination devices.

In addition, an advantage of the present invention is to provide a termination device and a system and a method for termination for an alarm system peripheral device which enable the termination device to be installed at a point in the alarm system which may be remote relative to the control panel of the alarm system.

Another advantage of the present invention is to provide a termination device and a system and a method for termination for an alarm system peripheral device which enable the termination device to be installed on-site.

Moreover, another advantage of the present invention is to provide a termination device and a system and a method for termination for an alarm system peripheral device which use a conductive gel associated with the termination device to prevent oxidation of wiring to which the termination device is connected.

Additional features and advantages of the present invention are described in, and will be apparent from, the detailed description of the presently preferred embodiments and from the drawings.

BRIEF DESCRIPTION OF THE DRAWINGS

FIG. 1 illustrates a prior art alarm system protection loop with a terminating device at the end of the line.

FIGS. 2-4 illustrate a system for termination for an alarm system peripheral device in embodiments of the present invention.

DETAILED DESCRIPTION OF THE PRESENTLY PREFERRED EMBODIMENTS

Figure 5:
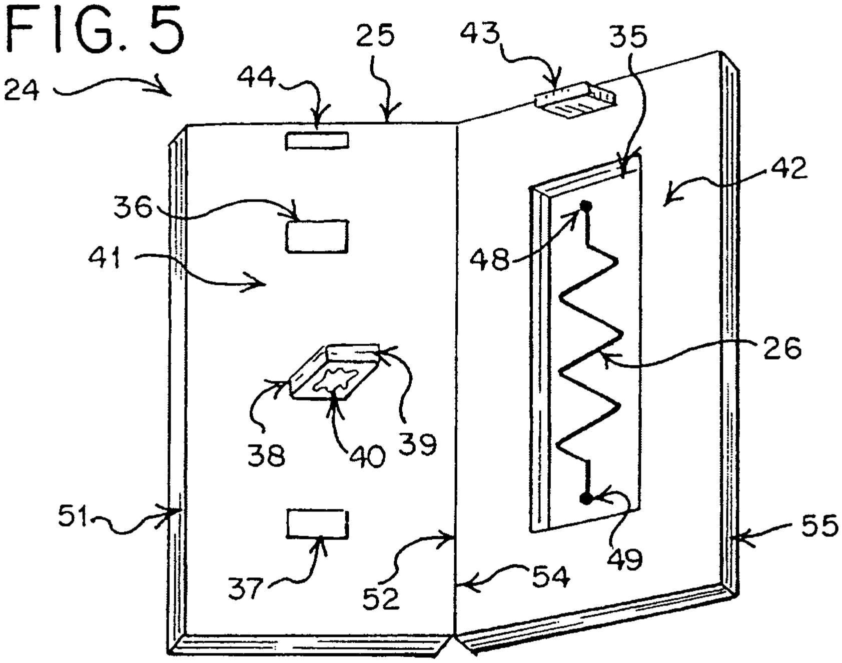
FIGS. 5 and 6 illustrate embodiments of the termination device.

The present invention generally relates to a termination device and a system and a method for termination for an alarm system peripheral device. More specifically, the present invention relates to a termination device which connects to wiring extending from the peripheral device. The termination device may have a resistor, a diode and/or a similar component which provides electrical resistance. In an embodiment, the termination device may have a potentiometer which may enable a user to adjust the electrical resistance. In an embodiment, the termination device may have a blade which may cut the wiring.

FIG. 1 depicts a typical alarm system 10 as used in the prior art. A signal originates from a control panel 11 and travels through a signal wiring protection loop 12 to a peripheral device 13. Then, the signal may be terminated by a termination device 14. Typically, the termination device 14 is a manually-installed resistor. Due to the effort required to install the termination device 14 at multiple remote locations, the termination device 14 is installed in the control panel 11. As previously set forth, installation of the termination device in the control panel 11 may cause false alarms for the typical alarm system 10 and/or may render the signal wiring protection loop 12 ineffective for detecting an alarm if the installation of the termination device 14 is faulty.

FIG. 2 depicts a system 20 for termination for a peripheral device 23 in an embodiment of the present invention. A signal may originate from a control panel 21 and may travel through a signal wiring protection loop 22 to the peripheral device 23. A termination device 24 may be located on the signal wiring protection loop 22. The termination device 24 may be adjacent to the peripheral device 23 and/or may be remote from the control panel 21.

FIGS. 3 and 4 generally illustrate the peripheral device 23 and the termination device 24 in embodiments of the present invention. The peripheral device 23 may be, for example, an initiating device, such as a camera, a sensor, a motion detector, a metal detector, a thermal detector, a smoke detector, a flame detector, a device which enables manual activation of an alarm, and/or the like; a notification device which generates an audible alarm and/or a visual alarm; and/or an input means, such as a keypad. The present invention is not limited to a specific embodiment of the peripheral device 23, and the peripheral device 23 may be any peripheral device known to one having ordinary skill in the art.

The peripheral device 23 may have incoming signal wiring 31 and/or outgoing signal wiring 32 which may extend from the peripheral device 23. In an embodiment, the incoming signal wiring 31 and/or the outgoing signal wiring 32 may have a cross-section in the shape of a circle, a square or a rectangle, for example; however, the incoming signal wiring 31 and/or the outgoing signal wiring 32 may have any cross-sectional shape. The incoming signal wiring 31 and/or the outgoing signal wiring 32 may be and/or may have a strand and/or a rod of electrically conductive metal. In an embodiment, the strand and/or the rod of electrically conductive metal may be encased by insulation material, such as, for example, a plastic, a rubber-like polymer, varnish and/or the like. The insulation material may be applied to the strand and/or the rod of electrically conductive metal by an extrusion process. The present invention is not limited to a specific embodiment of the incoming signal wiring 31 or the outgoing signal wiring 32, and the incoming signal wiring 31 and the outgoing signal wiring 32 may be any wiring known to one having ordinary skill in the art.

The incoming signal wiring 31 and/or the outgoing signal wiring 32 may connect the peripheral device 23 to the signal wiring protection loop 22. In an embodiment, the incoming signal wiring 31 and/or the outgoing signal wiring 32 may be connected to the peripheral device 23 by a screw terminal (not shown in the figures); as known to one having ordinary skill in the art, the screw terminal is an electrical connection at which a wire is clamped to metal by a screw. The present invention is not limited to a specific means for connecting the incoming signal wiring 31 and/or the outgoing signal wiring 32 to the peripheral device 23, and the incoming signal wiring 31 and/or the outgoing signal wiring 32 may be connected to the peripheral device 23 using any means known to one having ordinary skill in the art.

The termination device 24 may connect to the incoming signal wiring 31 and/or the outgoing signal wiring 32 as set forth in more detail hereafter. The termination device 24 may connect to the incoming signal wiring 31 and/or the outgoing signal wiring 32 to provide electrical resistance to the circuit formed by the signal wiring protection loop 22. As shown in FIG. 3, the peripheral device 23 may form a closed circuit, and/or the termination device 24 may connect to one of the incoming signal wiring 31 and the outgoing signal wiring 32. FIG. 3 depicts the termination device 24 connected to the outgoing signal wiring 32; alternatively, the termination device 24 may be connected to the incoming signal wiring 31. As shown in FIG. 4, the peripheral device 23 may form an open circuit, and/or the termination device 24 may connect to the incoming signal wiring 31 and the outgoing signal wiring 32.

FIG. 5 generally illustrates an embodiment of the termination device 24. The termination device 24 may have a housing 25. The housing 25 may be sized to be hand-held by a user. A resistor/diode 26 may be connected to and/or located within the housing 25 of the termination device 24. As known to one having ordinary skill in the art, a resistor is a two-terminal passive electronic component which provides electrical resistance, and a diode is a crystalline piece of semiconductor material connected to two electrical terminals which conducts electric current in only one direction. The resistor/diode 26 may have a resistance value. The present invention is not limited to a specific embodiment of the resistor/diode 26, and the resistor/diode 26 may be any component of the termination device 24 which provides an electrical resistance.

The resistor/diode 26 may be pre-installed in the termination device 24 so that the termination device 24 may be selected to have an electrical resistance value which complies with the requirements of the control panel 21 and/or the system 20. Alternatively, the resistor/diode 26 may be reversibly removable from the termination device 24 so that the resistor/diode 26 may be selected to have a desired electrical resistance value. The resistor/diode 26 may be connected to the termination device 24 before the termination device 24 is connected to the selected wiring. For example, the termination device 24 may have a compartment 35 in which the resistor/diode 26 may be placed and/or from which the resistor/diode 26 may be removed. As a result, an additional resistor/diode having a different electrical resistance may replace the resistor/diode so that the termination device 24 may have a different electrical resistance.

A first connector 36 and/or a second connector 37 may be connected to the housing 25 of the termination device 24. The second connector 37 may be located in a position opposite to the first connector 36. The termination device 24 is connected to the incoming signal wiring 31 and/or the outgoing signal wiring 32 as discussed in more detail hereafter. As a result, the first connector 36 and/or the second connector 37 may contact the strand and/or the rod of electrically conductive metal in the incoming signal wiring 31 and/or the outgoing signal wiring 32.

A blade 38 may be located between the first connector 36 and/or the second connector 37. The blade 38 may extend from the housing 25 of the termination device 24. The termination device is connected to the incoming signal wiring 31 and/or the outgoing signal wiring 32 as discussed in more detail hereafter. As a result, the blade 38 may have an edge 39 which may cut the incoming signal wiring 31 and/or the outgoing signal wiring 32. In a preferred embodiment, the blade 38 and/or the housing 25 may be made from electrically non-conductive material.

The housing 25 of the termination device 24 may have a first section 41 and/or a second section 42. The first section 41 may be located in a position opposite to the second section 42. The blade 38 may extend from one of the first section 41 and the second section 42. In an embodiment, the resistor/diode 26 and/or the compartment 35 may be located on the opposite section of the housing 25 relative to the blade 38. The first section 41 and/or the second section 42 may have any shape; in an embodiment, the first section 41 and/or the second section 42 may be rectangular. The first section 41 may be hinged relative to the second section 42. More specifically, the first section 41 may have a first side 51 and/or a second side 52, and/or the second section 42 may have a first side 54 and/or a second side 55. The second side 52 of the first section 41 may be connected to and/or integral with the first side 54 of the second section 42. The first side 51 of the first section 41 may move in a direction toward and/or in a direction away from the second side 55 of the second section 42.

The termination device 24 may be connected to selected signal wiring which may be one of the incoming signal wiring 31 and/or outgoing signal wiring 32. More specifically, one of the first section 41 and the second section 42 of the housing 25 of the termination device 24 may be placed adjacent to the selected signal wiring. The selected wiring may be located between the first section 41 and the second section 42 of the housing 25 of the termination device 24. Then, the first side 51 of the first section 41 may be moved in a direction toward the second side 55 of the second section 42. As a result, the first side 51 of the first section 41 may be positioned proximate to the second side 55 of the second section 42, and/or the blade 38 may cut the selected wiring. A tool (not shown in the figures) may be used to push the first section 41 and the second section 42 into each other; alternatively, a user may use one hand or two hands to push the first section 41 and the second section 42 into each other.

One of the first section 41 and the second section 42 may have one or more extensions 43, and/or one or more grooves 44 may be located in the termination device 24 in a position opposite to the extensions 43. The extensions 43 may insert into the grooves 44 to maintain a position of the termination device 24 on the incoming signal wiring 31 and/or the outgoing signal wiring 32. The extensions 43 may be removed from the grooves 44 to remove the termination device 24 from the incoming signal wiring 31 and/or the outgoing signal wiring 32.

If the termination device 24 is connected to the incoming signal wiring 31 and/or the outgoing signal wiring 32, the voltage from the incoming signal wiring 31 and/or the outgoing signal wiring 32, respectively, may be applied to the resistor/diode 26. As a result, the resistor/diode 26 may generate electrical resistance for the signal wiring protection loop 22. For example, the voltage from the incoming signal wiring 31 and/or the outgoing signal wiring 32 may enter a first terminal 48 of the resistor/diode 26 and may travel through the resistor/diode 26 to a second terminal 49 of the resistor/diode 26 before exiting the termination device 24. In an embodiment, the first connector 36 and/or the second connector 37 may be a pin, a shaft and/or the like which may pierce the insulation material to contact the strand and/or rod of electrically conductive metal. The first connector 36 and/or the second connector 37 contacting the strand and/or the rod of electrically conductive metal may enable the voltage from the selected wiring to which the termination device 24 may be attached to enter and/or exit the resistor/diode 26.

Figure 6:
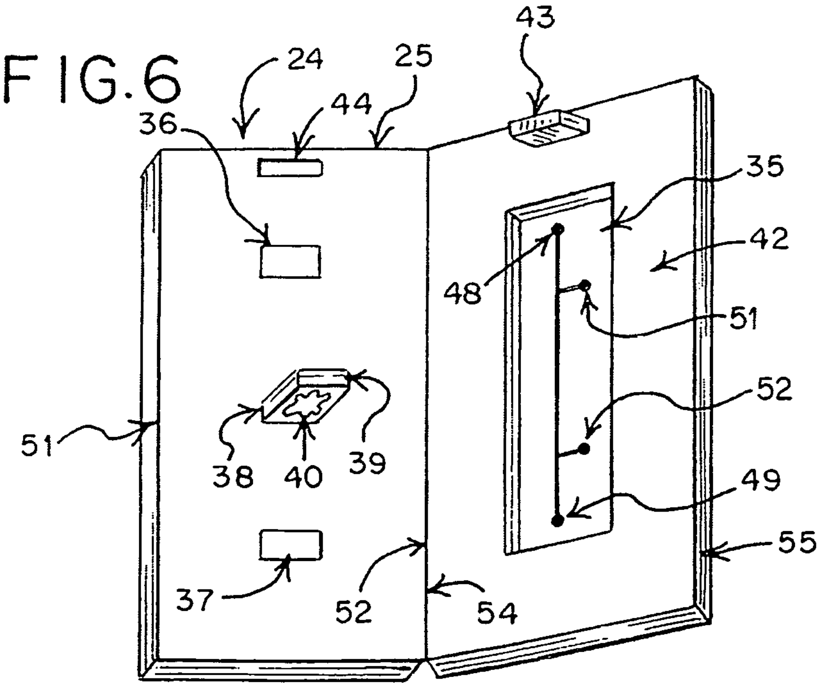

FIG. 6 generally illustrates an embodiment where the resistor/diode 26 is a first potentiometer 51 and/or a second potentiometer 52. As known to one having ordinary skill in the art, a potentiometer is a three-terminal resistor with a sliding contact that forms an adjustable voltage divider, and the resistance value of the potentiometer may be adjusted by moving the sliding contact. The first potentiometer 51 and/or the second potentiometer 52 may be pre-installed on the housing 25 of the termination device 24.

In an embodiment, the termination device 24 may have both the first potentiometer 51 and the second potentiometer 52. The first potentiometer 51 may provide a resistance value from zero to 1,000K, and the second potentiometer 52 may provide a resistance value from zero to 100K. The first potentiometer 51 may be adjusted using a first knob (not shown in the figures) which turns in 100K increments, and the second potentiometer 52 may be adjusted using a second knob (not shown in the figures) which turns in 10K increments. As a result, the first potentiometer 51 and the second potentiometer 52 may enable a user to establish and/or adjust the resistance value of the termination device 24.

In an embodiment, an electrically conductive material 40 may be coated on, associated with and/or affixed to the housing 25, the blade 38, the first connector 36 and/or the second connector 37. In an embodiment, the electrically conductive material 40 may be a conductive gel, such as, for example, a silicone gel which may contain silver-based compounds. In an embodiment, the electrically conductive material 40 may inhibit oxidation of the strand and/or the rod of electrically conductive metal to which the termination device 24 is attached.

It should be understood that various changes and modifications to the presently preferred embodiments described herein will be apparent to those skilled in the art. Such changes and modifications may be made without departing from the spirit and scope of the present invention and without diminishing its attendant advantages. It is, therefore, intended that such changes and modifications be covered by the appended claims.

I claim:

1. A system for terminating an alarm signal protection loop connected to a control panel, the system comprising:

a peripheral component connected to the alarm signal protection loop;

a first wire which extends from the peripheral component to connect the peripheral component to the alarm signal protection loop wherein the first wire conveys voltage between the control panel and the peripheral device;

a termination device which connects to the first wire at a position adjacent to the peripheral component wherein the termination device has a housing;

a resistor connected to the housing of the termination device wherein the termination device connects to the first wire to convey voltage from the first wire through the resistor and further wherein the resistor provides an electrical resistance; and a blade which extends from the housing wherein the blade has an edge which cuts the first wire when the termination device is connected to the first wire.

2. The system of claim 1 further comprising:

an extension protruding from the housing wherein the extension inserts in a groove in the housing to maintain connection of the termination device to the first wire.

3. The system of claim 1 further comprising:

a compartment in the housing wherein the resistor inserts in and removes from the compartment to reversibly connect and disconnect the resistor to the termination device.

4. The system of claim 1 wherein the resistor is integral with the housing.

5. The system of claim 1 wherein the resistor is a potentiometer which enables a user to change the electrical resistance.

6. The system of claim 1 further comprising:

an electrically conductive gel associated with the housing.

7. The system of claim 1 further comprising:

a first pin and a second pin integral with the housing wherein the first pin is located in a position opposite to the second pin and further wherein the first pin and the second pin convey the voltage between the resistor and the wire.

8. The system of claim 1 further comprising:

a second wire which conveys the voltage from the peripheral device wherein the first wire conveys voltage to the peripheral device and further wherein a first end of the termination device connects to the first wire wherein a second end connects to the second wire and further wherein the first end is located in a position opposite to the second end.

9. A system for terminating an alarm signal protection loop connected to a control panel, the system comprising:

a peripheral component connected to the alarm signal protection loop;

a first wire which extends from the peripheral component to connect the peripheral component to the alarm signal protection loop wherein the first wire conveys voltage between the control panel and the peripheral device;

a termination device which connects to the first wire at a position adjacent to the peripheral component wherein the termination device has a housing;

a resistor connected to the housing of the termination device wherein the termination device connects to the first wire to convey voltage from the first wire through the resistor and further wherein the resistor provides an electrical resistance; and an extension protruding from the housing wherein the extension inserts in a groove in the housing to maintain connection of the termination device to the first wire.

10. The system of claim 9 further comprising:

a compartment in the housing wherein the resistor inserts in and removes from the compartment to reversibly connect and disconnect the resistor to the termination device.

11. The system of claim 9 wherein the resistor is integral with the housing.

12. The system of claim 9 wherein the resistor is a potentiometer which enables a user to change the electrical resistance.

13. The system of claim 9 further comprising:

an electrically conductive gel associated with the housing.

14. The system of claim 9 further comprising:

a first pin and a second pin integral with the housing wherein the first pin is located in a position opposite to the second pin and further wherein the first pin and the second pin convey the voltage between the resistor and the wire.

15. The system of claim 9 further comprising:

a second wire which conveys the voltage from the peripheral device wherein the first wire conveys voltage to the peripheral device and further wherein a first end of the termination device connects to the first wire wherein a second end connects to the second wire and further wherein the first end is located in a position opposite to the second end.

16. A system for terminating an alarm signal protection loop connected to a control panel, the system comprising:

a peripheral component connected to the alarm signal protection loop;

a first wire which extends from the peripheral component to connect the peripheral component to the alarm signal protection loop wherein the first wire conveys voltage between the control panel and the peripheral device;

a termination device which connects to the first wire at a position adjacent to the peripheral component wherein the termination device has a housing;

a resistor connected to the housing of the termination device wherein the termination device connects to the first wire to convey voltage from the first wire through the resistor and further wherein the resistor provides an electrical resistance; and a compartment in the housing wherein the resistor inserts in and removes from the compartment to reversibly connect and disconnect the resistor to the termination device.

17. The system of claim 16 further comprising:

an extension protruding from the housing wherein the extension inserts in a groove in the housing to maintain connection of the termination device to the first wire.

18. The system of claim 16 further comprising:

an electrically conductive gel associated with the housing.

19. The system of claim 16 further comprising:

a first pin and a second pin integral with the housing wherein the first pin is located in a position opposite to the second pin and further wherein the first pin and the second pin convey the voltage between the resistor and the wire.

20. The system of claim 16 further comprising:

a second wire which conveys the voltage from the peripheral device wherein the first wire conveys voltage to the peripheral device and further wherein a first end of the termination device connects to the first wire wherein a second end connects to the second wire and further wherein the first end is located in a position opposite to the second end.

* * * * *